United States Patent [19]

Muto

[11] Patent Number: 5,438,691
[45] Date of Patent: Aug. 1, 1995

[54] RECEIVER USING A PLURALITY OF AMPLIFIERS AND ANALOG-TO-DIGITAL CONVERTERS FOR DEMODULATING AND DECODING A SIGNAL

[75] Inventor: Hiroyasu Muto, Tokyo, Japan

[73] Assignee: NEC Corporation, Tokyo, Japan

[21] Appl. No.: 249,220

[22] Filed: May 26, 1994

[30] Foreign Application Priority Data

May 27, 1993 [JP] Japan ............................... 5-126108

[51] Int. Cl.⁶ ............................................. H04B 1/16
[52] U.S. Cl. ................................. 455/309; 455/312; 375/317
[58] Field of Search ............. 455/234.1, 234.2, 235.1, 455/303, 308, 309, 226.2, 334, 338, 312; 375/75, 76, 98, 102

[56] References Cited

U.S. PATENT DOCUMENTS

| | | | |
|---|---|---|---|
| 4,581,725 | 4/1986 | Pilarcik, Jr. ......................... | 375/76 |
| 5,233,634 | 8/1993 | Väisänen ....................... | 455/234.1 X |
| 5,301,364 | 4/1994 | Arens et al. ....................... | 375/98 X |

FOREIGN PATENT DOCUMENTS 61-142823 6/1986 Japan .
63-250918 10/1988 Japan .

*Primary Examiner*—Edward F. Urban
*Assistant Examiner*—Chi H. Pham
*Attorney, Agent, or Firm*—Whitham, Curtis, Whitahm & McGinn

[57] ABSTRACT

In a receiver, a plurality of amplifiers each having a particular amplification factor amplifies a received signal. Analog-to-digital converters (ADCs) each converts the output of the respective amplifier to a digital value. The resulting digital values from the ADCs are written to respective memories. At the same time, maximum amplitude detectors respectively detect the maximum amplitudes of the associated digital values. A comparator locates, among the lines where the maximum amplitude of a burst does not reach either a positive saturation level or a negative saturation level, the line having a great amplification factor every time a burst appears. On receiving a control signal from the comparator, a selector transfers the digital value stored in the memory of the line selected to a signal processor. The signal processor demodulates and decodes the received signal based on the input digital value and delivers the output thereof to an output terminal.

2 Claims, 4 Drawing Sheets

RECEIVER USING A PLURALITY OF AMPLIFIERS AND ANALOG-TO-DIGITAL CONVERTERS FOR DEMODULATING AND DECODING A SIGNAL

BACKGROUND OF THE INVENTION

The present invention relates to a receiver and, more particularly, to a receiver for demodulating and decoding a received signal by digitizing it with accuracy high enough for demodulation without changing the characteristic of a transmission path.

It has been customary with a receiver to amplify a received signal coming in through an input terminal by an amplifier, digitize the amplified signal by an analog-to-digital converter (ADC), store the resulting digital value in a memory, and demodulate and decode the received signal based on the digital value stored in the memory. So long as modulation is implemented by frequency modulation or phase modulation and the signal is free from the influence of fading, it is possible to reduce the number of quantizing bits of the ADC by implementing the amplifier as an automatic gain control (AGC) circuit, i.e., by optimizing the input level of the signal to the ADC. Alternatively, a reference input voltage for the ADC and, therefore, a quantizing level may be changed stepwise in accordance with the level of the input signal in order to broaden a dynamic range, as proposed in Japanese Patent Laid-Open Publication Nos. 63-250918 and 61-142823.

Assume that the signal input to the receiver suffers from fading and is corrected by an equalizer, that a QAM (Quadrature Amplitude Modulation) system is used and the position of a signal point on rectangular coordinates is determined by use of a pilot signal which will have a known phase at a known time, or that the QAM system is used and the position of a signal point on rectangular coordinates is determined after fading correction. The prerequisite with any of such schemes is that the characteristic of a transmission path be not changed. Using an AGC circuit or changing the reference input voltage is not practicable since it would change the characteristic of a transmission path. When the receiver receives a signal in the form of bursts, an input signal strength may be estimated beforehand in order to provide the amplifier with a matching amplification factor or to set up a matching reference input voltage; the amplification ratio or the reference input signal will not be changed during the reception of bursts. However, the estimation is impossible in an environment suffering from fading. The only way left is, therefore, using an ADC having a number of bits great enough to cover a broad dynamic range.

SUMMARY OF THE INVENTION

It is, therefore, an object of the present invention to provide a receiver capable of demodulating and decoding a received signal, which has a broad dynamic range and is received in an environment causing the input signal strength to change every moment, with accuracy high enough for modulation without changing the characteristic of a transmission path.

In accordance with the present invention, a receiver for demodulating and decoding a signal, which is received in an environment causing an input signal strength to change every moment, by converting the signal to a digital value with accuracy great enough for demodulation without changing the characteristic of a transmission path comprises a plurality of amplifiers each having a particular amplification factor for amplifying the signal, a plurality of ADCs respectively connected to the plurality of amplifiers for converting the outputs of the amplifiers to digital values, a plurality of memories respectively connected to the ADCs for storing the digital values, a plurality of maximum amplitude detectors respectively connected to the ADCs for detecting the maximum amplitudes of the digital values, a comparator for comparing the maximum amplitudes output from the maximum amplitude detectors with a positive and a negative saturation level, a selector responsive to a control signal from the comparator for selecting and outputting one of the digital values stored in the memories, and a signal processor for demodulating and decoding the signal on the basis of the digital value fed from the comparator.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
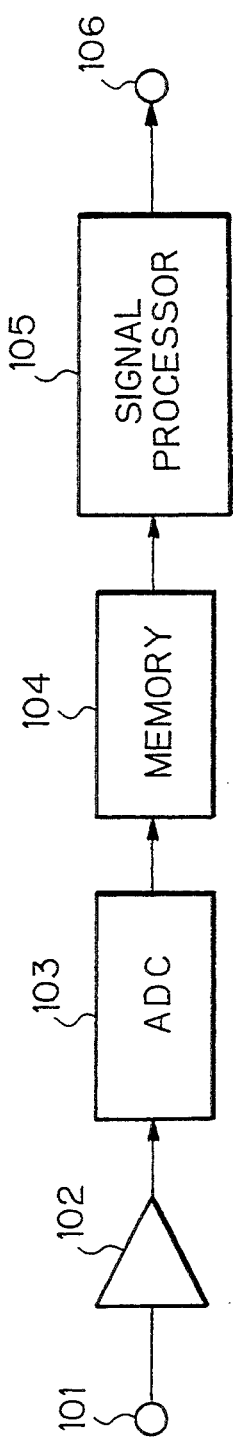
FIG. 1 is a block diagram schematically showing a conventional receiver.

To better understand the present invention, a brief reference will be made to a conventional receiver, shown in FIG. 1. As shown, the receiver has an input terminal 101, an amplifier 102 connected to the input terminal 101, an analog-to-digital converter (ADC) 103 connected to the amplifier 102, a memory 104 connected to the ADC 103, a signal processor 105 connected to the memory 104, and an output terminal 106 connected to the signal processor 105. A received signal is routed through the input terminal 101 to the amplifier 102 to be amplified thereby. The amplified signal from the amplifier 102 is digitized by the ADC 103 and then stored in the memory 104. The digital signal stored in the memory 104 is demodulated and decoded by the signal processor 105. The demodulated signal is fed out via the output terminal 106.

However, it is difficult for the conventional receiver to digitize the received signal, having a broad dynamic range and affected by fading, with accuracy high enough to demodulate it without changing the characteristic of a transmission path, as discussed earlier. It follows that an ADC capable of covering a broad dynamic range, i.e., having a great number of bits has to be used.

Figure 2:
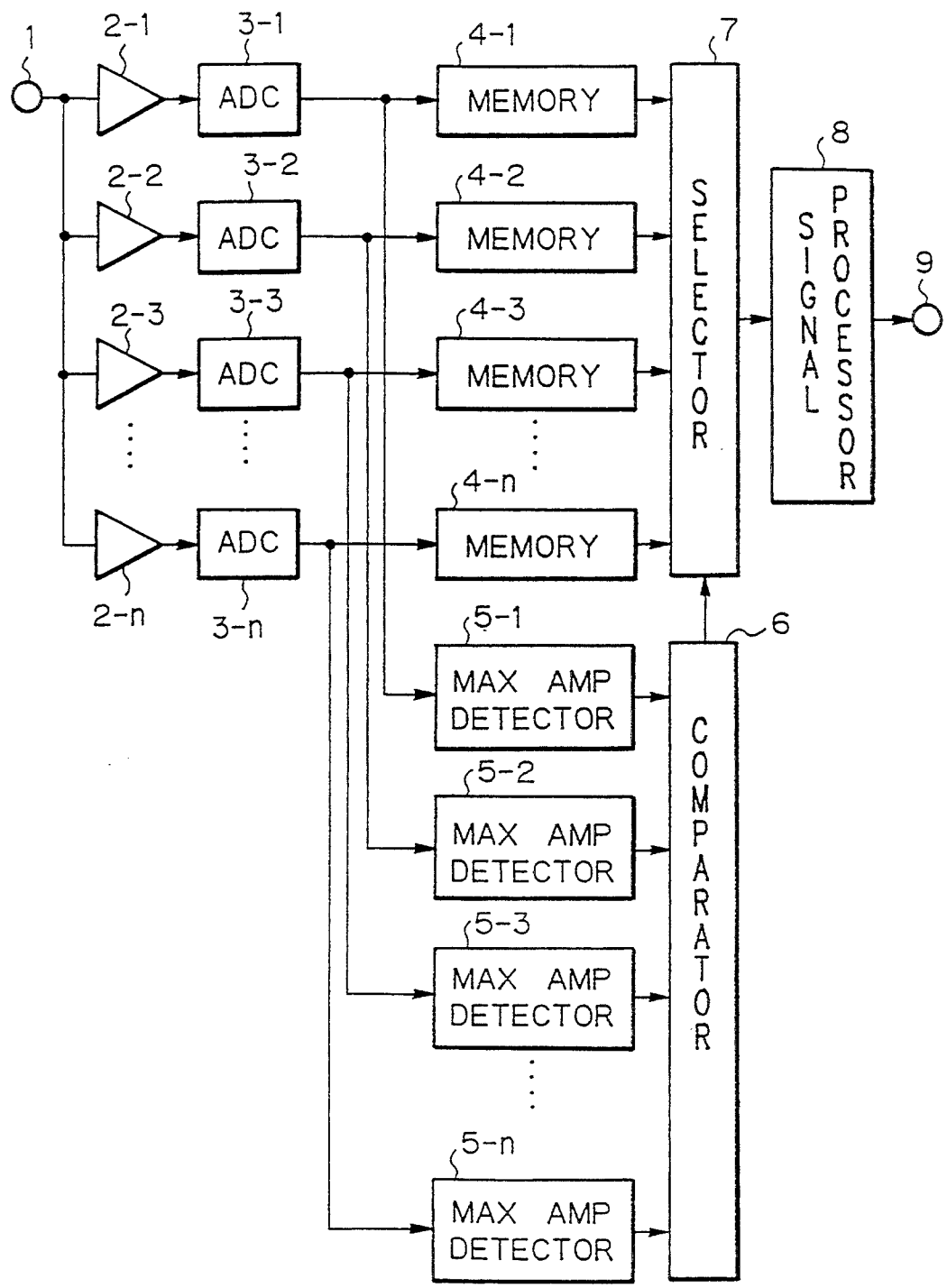
FIG. 2 is a block diagram schematically showing a receiver embodying the present invention.

Referring to FIG. 2, a receiver embodying the present invention is shown. As shown, the receiver has an input terminal 1, a plurality of amplifiers 2-1, 2-2, . . . , 2-n connected to the input terminal 1 and each having a particular amplification factor, ADCs 3-1, 3-2, . . . , 3-n respectively connected to the amplifiers 2-1, 2-2 . . . , 2-n, memories 4-1, 4-2 . . . 4-n respectively connected to the ADCs 3-1, 3-2, . . . , 3-n, maximum amplitude (MAX AMP) detectors 5-1, 5-2, . . . , 5-n, a single comparator 6 connected to the maximum amplitude detectors 5-1, 5-2, 5-n, a single selector 7 connected to the memories 4-1, 4-2, . . . , 4-n and comparator 6, a signal processor 8 connected to the selector 7, and an output terminal 9 connected to the signal processor 8.

In operation, a signal received by the receiver is amplified by the amplifiers 2-1 to 2-n each having a particular amplification factor. The resulting outputs of the amplifiers 2-1 to 2-n are digitized by the ADCs 3-1 to 3-n, respectively. The digital values output from the ADCs 3-1 to 3-n are written to the memories 4-1 to 4-n, respectively. At the same time, the digital values are applied to the maximum amplitude detectors 5-1 to 5-n. These detectors 5-1 to 5-n detect the maximum amplitudes of the digital values input thereto.

Figure 3A:
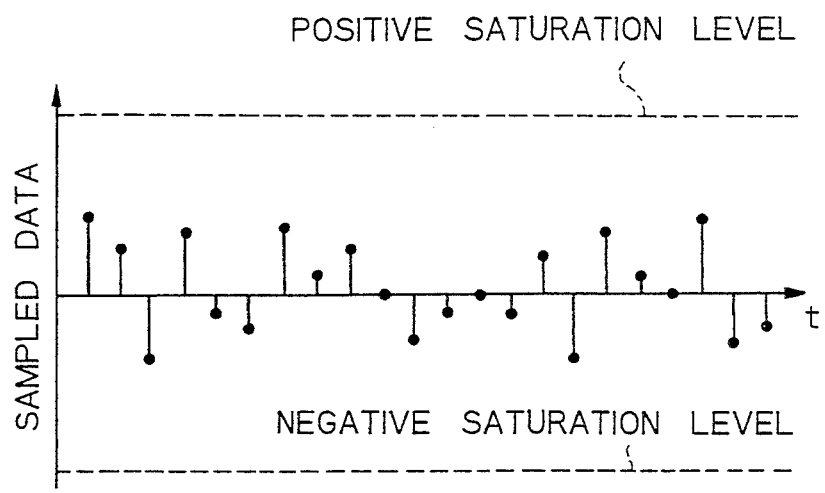
FIGS. 3A-3C each shows specific data selected after analog-to-digital conversion.
Figure 3B:
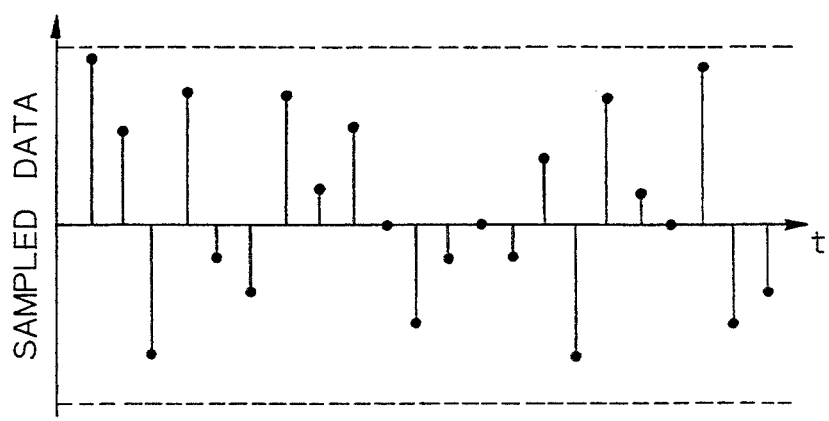
Figure 3C:
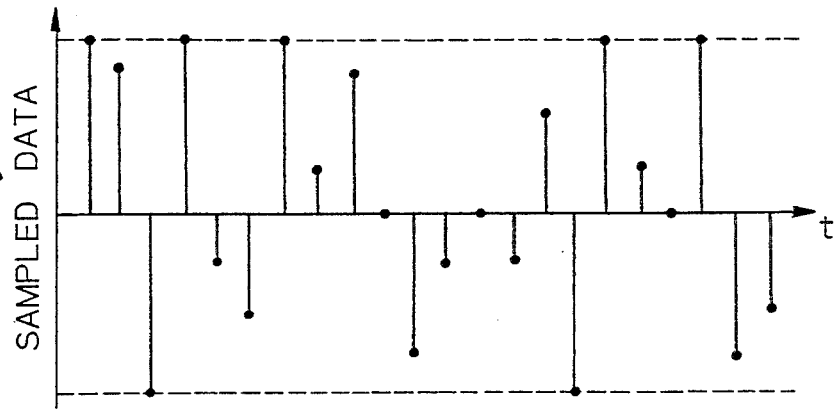

FIGS. 3A-3C each shows digital data resulting from a signal amplified by an amplifier having a particular amplification factor. Specifically, FIGS. 3A-3C are respectively indicative of cases wherein the amplification ratio is small, great, and further great. As shown, the accuracy of digitized data is low when the amplification factor is small (FIG. 3A) or high when it is great (FIG. 3B). When the amplification factor is further great (FIG. 3C), correct data is not achievable since some of the digitized data reach the positive and negative saturation levels, i.e., since the input signal does not lie in the reference input voltage range of an ADC.

Every time a burst appears, the comparator 6 locates, maximum among the lines where the amplitude of the burst does not reach either the positive saturation level or the negative saturation level, the line having a great amplification ratio. Then, the comparator 6 delivers a control signal to the selector 7, informing it of the line selected. In response, the selector 7 transfers the data stored in the memory 4 of the line selected to the signal processor 8. The signal processor 8 demodulates and decodes the input data by via digital signal processing. The demodulated data is fed out the output terminal 9.

An alternative embodiment of the present invention will be described with reference to FIG. 4. As shown, the receiver has an input terminal 11, a plurality of amplifiers 12-1, 12-2, . . . , 12-n connected to the input terminal 11 and each having a particular amplification factor, quadrature (Q) demodulators 13-1, 13-2, . . . , 13-n respectively connected to the amplifiers 12-1, 12-2, . . . , 12-n, ADCs 14-1a, 14-1b, . . . , 14-na, 14-nb each being connected to either output terminal of the quadrature demodulators 13-1, 13-2, . . . , 13-n on which the in-phase component or the orthogonal component of a demodulated signal appears, memories 15-1a, 15-1b, . . . , 15-na, 15-nb respectively connected to the ADCs 14-1a, 14-1b, . . . , 14-na, 14-nb, maximum amplitude (MAX AMP) detectors 16-1a, 16-1b, . . . , 16-na, 16-nb respectively connected to the ADCs 14-1a, 14-1b . . . , 14-na, 14-nb, a single comparator 17 connected to the maximum amplitude detectors 16-1a, 16-1b, . . . , 16-na, 16-nb, a single selector 18 connected to the memories 15-1a, 15-1b . . . , 15-na, 15-nb and comparator 17, a signal processor 19 connected to the selector 18, and an output terminal 20 connected to the signal processor 19.

The operation of the alternative embodiment is as follows. A signal received by the receiver is amplified by the amplifiers 12-1 to 12-n each having a particular amplification factor. The quadrature demodulators 13-1 to 13-n quadrature-demodulate the outputs of the amplifiers 12-1 to 12-n, respectively. The demodulated signals from the demodulators 13-1 to 13-n are respectively digitized by the ADCs 14-1a to 14-nb and then written to the memories 15-1a to 15-nb. The maximum amplitude detectors 16-1 to 16-nb each detects the maximum amplitude of the demodulated signal fed thereto from associated one of the ADCs 14-1a to 14-nb. The comparator 17 locates, among the lines where the maximum amplitude of a burst does not reach the saturation levels, the line having a great amplification factor every time a burst arrives. Then, the comparator 17 sends a control signal to the selector 18, informing it of the line selected. In response, the selector 18 transfers the data stored in the memory 15 of the line selected to the signal processor 19. As a result, the signal processor decodes the input data and delivers the decoded data to the output terminal 20.

Figure 4:
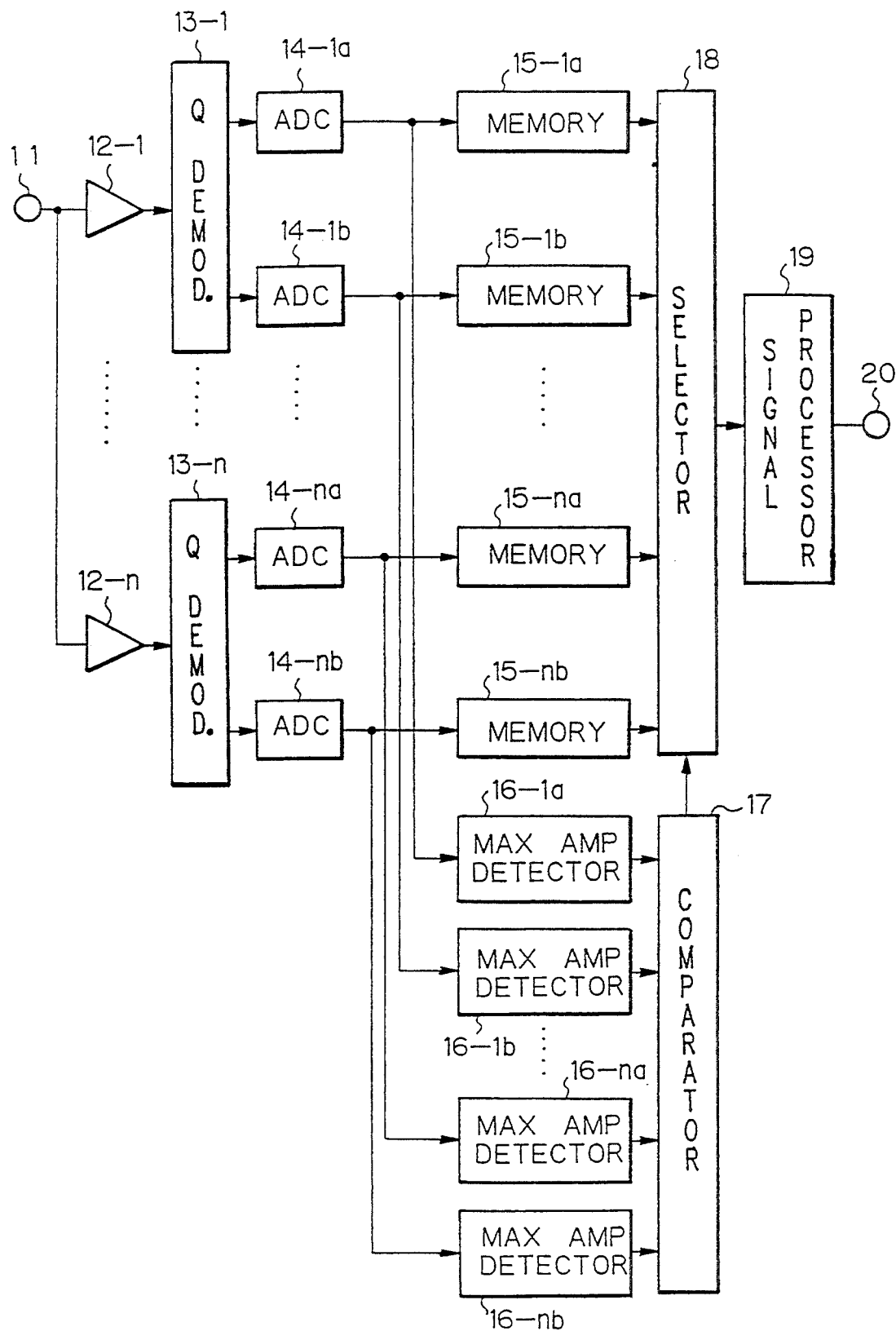
FIG. 4 is a schematic block diagram showing an alternative embodiment of the present invention.

As stated above, the embodiment of FIG. 2 samples and digitizes an intermediate frequency signal and then demodulates it, while the embodiment of FIG. 4 demodulates the signal by quadrature demodulation, samples the demodulated signal, and then digitizes it.

In summary, it will be seen that the present invention provides a receiver having maximum amplitude detectors and a selector cooperating to select, among digitized values appeared during a given interval, the value giving an optimal level, and a signal processor to which such a particular digitized value is applied. The signal processor, therefore, demodulates and decodes a received signal with unprecedented accuracy.

Various modifications will become possible for those skilled in the art after receiving the teachings of the present disclosure without departing from the scope thereof.

What is claimed is:

1. A receiver for demodulating and decoding a signal, which is received in an environment causing an input signal strength to change every moment, by converting said signal to a digital value with accuracy great enough for demodulation without changing a characteristic of a transmission path, said receiver comprising:

a plurality of amplifiers each having a particular amplification factor for amplifying the signal;

a plurality of analog-to-digital converters (ADCs) respectively connected to said plurality of amplifiers for converting outputs of said amplifiers to digital values;

a plurality of memories respectively connected to said plurality of ADCs for storing the digital values;

a plurality of maximum amplitude detectors respectively connected to said plurality of ADCs for detecting maximum amplitudes of the digital values;

a comparator for comparing the maximum amplitudes output from said plurality of maximum amplitude detectors with a positive and a negative saturation level;

a selector responsive to a control signal from said comparator for selecting and outputting one of the digital values stored in said plurality of memories; and a signal processor for demodulating and decoding the signal on the basis of the digital value fed from said selector.

2. A receiver as claimed in claim 1, further comprising a plurality of quadrature demodulators respectively intervening between said plurality of amplifiers and said plurality of ADCs, said plurality of ADCs being each connected to either output terminal of one of said plurality of quadrature demodulators on which an in-phase component or an orthogonal component of a demodulated signal appears.

* * * * *